United States Patent

Ludikhuize et al.

[11] Patent Number: 5,324,978
[45] Date of Patent: Jun. 28, 1994

[54] SEMICONDUCTOR DEVICE HAVING AN IMPROVED BREAKDOWN VOLTAGE-RAISING STRUCTURE

[75] Inventors: Adrianus W. Ludikhuize; Franciscus A. C. M. Schoofs, both of Eindhoven, Netherlands

[73] Assignee: U.S. Philips Corporation, New York, N.Y.

[21] Appl. No.: 94,803

[22] Filed: Jul. 20, 1993

[30] Foreign Application Priority Data

Jul. 20, 1992 [EP] European Pat. Off. ........... 92202210

[51] Int. Cl.5 .................... H01L 29/34; H01L 29/80; H01L 27/01
[52] U.S. Cl. .................... 257/494; 257/271; 257/285; 257/367; 257/409; 257/492; 257/493; 257/495
[58] Field of Search ............... 257/271, 285, 367, 409, 257/492, 493, 494, 495

[56] References Cited

U.S. PATENT DOCUMENTS

| 4,573,066 | 2/1986 | Whight | 257/495 |
| 4,750,028 | 7/1988 | Ludikhuize | 357/52 |
| 4,774,560 | 9/1988 | Coe | 257/495 |
| 5,083,176 | 1/1992 | Slaher | 257/495 |
| 5,223,919 | 6/1993 | Whight et al. | 257/494 |

FOREIGN PATENT DOCUMENTS

| 58-33881 | 2/1983 | Japan | 257/494 |
| 63-138766 | 6/1988 | Japan | 257/494 |
| 1-136372 | 5/1989 | Japan | 257/494 |
| 1-295460 | 11/1989 | Japan | 257/494 |

*Primary Examiner*—Ngan Ngo
*Attorney, Agent, or Firm*—Steven R. Biren

[57] ABSTRACT

It is usual in high-voltage integrated circuits to provide one or several breakdown-voltage-raising rings at the edge of a high-voltage island in the form of surface zones of the conductivity type opposite to that of the island. According to the invention, the function of these rings is locally taken over by one or several zones forming part of a circuit element and also provided with a breakdown-voltage-raising edge. Since the breakdown-voltage-raising zones are locally omitted alongside the island insulation, a major space saving can be achieved.

9 Claims, 2 Drawing Sheets

SEMICONDUCTOR DEVICE HAVING AN IMPROVED BREAKDOWN VOLTAGE-RAISING STRUCTURE

BACKGROUND OF THE INVENTION

The invention relates to a semiconductor device with a semiconductor body comprising an island-shaped first region of a first conductivity type adjoining a surface and adjoining thereto and also adjoining the surface a second region of the second conductivity type which, seen at the surface, surrounds the first region along its entire circumference and forms a pn junction therewith and which is provided with a breakdown voltage raising edge in the form of a first surface zone of the second conductivity type which is provided in the first region and which is situated at such a small distance from the second region that, given a sufficiently high voltage in the reverse-bias direction across the pn junction, the surface zone is entirely situated within the depletion region of the blocked pn junction. The semiconductor body may be of a usual construction with a silicon substrate of the second conductivity type and an epitaxial layer of the first conductivity type provided thereon. Usually, the substrate is of the p type and the epitaxial layer, or epi layer for short, of the n type. Obviously, however, the conductivity types may be interchanged. An island-shaped first region is defined in the epi layer by means of a p-type island insulation zone surrounding the island and forming the said second region of the second conductivity type. In alternative embodiments, the first region is formed, for example, by an n-type implanted zone (well or pocket) provided in a p-type substrate, the second region of the second conductivity type being formed by non-redoped adjoining portions of the substrate. The background of the invention and the invention itself will be described hereinafter in particular with reference to the first embodiment indicated here, but it will be obvious that the invention is not to be limited to embodiments comprising an epi layer.

During operation the pn junction between the island and the insulation zone is reverse-biased for obtaining a good island insulation. The voltage across the junction must be lower than the breakdown voltage of the pn junction. It is known that the breakdown voltage of planar pn junctions is often considerably lower than might be expected on the ground of the doping concentrations. This is due inter alia to local increases in the field strength caused by inter alia surface effects and in particular by the edge curvature of the pn junction.

A semiconductor device of the kind described in the opening paragraph is known from inter alia U.S. Pat. No. 4,750,028. This describes a device in which a number of comparatively weakly doped p-type surface zones are provided along the edge of the island for reducing the field strength where the pn junction intersects the surface between the island and the insulation zone. Although a single ring situated within the depletion region of the pn junction already leads to a considerable improvement of the breakdown voltage, several rings next to one another are preferably used, as also shown in the said U.S. Patent, the outermost ring directly adjoining the insulation zone while the remaining rings are situated at a distance from one another. In particular when several breakdown-voltage-raising rings are used, this configuration requires comparatively much space in the semiconductor body which cannot usually be effectively used for providing circuit elements.

SUMMARY OF THE INVENTION

The invention has for its object inter alia to provide a semiconductor device of the kind described above in which the edge of breakdown voltage raising zones effectively occupies less space than in known devices. The invention is based inter alia on the recognition that the function of the breakdown voltage raising edge can be taken over at least locally by active circuit elements and that the edge accordingly can be omitted at the areas of said circuit elements. A semiconductor of the kind described in the opening paragraph, according to the invention, is characterized in that the breakdown-voltage-raising zone extends only along part of the circumference of the island adjacent the second region and in that in the first region, adjacent a portion of the second region which is free from the breakdown-voltage-raising zone, a zone of the second conductivity type is situated, called circuit zone hereinafter, which forms part of a circuit element and which at the side remote from the portion of the second region which is free from the breakdown-voltage-raising zone is provided with a second breakdown-voltage-raising surface zone of the second conductivity type which is present at such a small distance from the circuit zone that, given a sufficiently high voltage in the reverse-bias direction across the pn junction between the circuit zone and the first region, the second breakdown-voltage-raising zone lies entirely within the depletion region of this blocked pn junction. Since the breakdown-voltage-raising zone is not provided along the entire circumference of the island, space is advantageously saved without the breakdown voltage being lowered thereby. The extent of the space saving depends on a number of factors such as the size and the number of breakdown-voltage-raising zones and on the size of the circuit zone. Usually, the first and the second breakdown-voltage-raising surface zones will each comprise a zone of the second conductivity type, called first partial zone hereinafter, which adjoins the second region and the circuit zone, respectively, and which has a lower doping concentration than the adjoining second region or circuit zone. An important embodiment of a device according to the invention with a considerable space saving because of the comparatively great width of the breakdown-voltage-raising zone is characterized in that the first and the second breakdown-voltage-raising zones each also comprise at least one further partial zone which is situated at a distance from the first partial zone and which is entirely surrounded by the first region of the first conductivity type within the semiconductor body. Since the breakdown-voltage-raising zones are split up into separate partial zones, and thus require comparatively much space, it is possible to choose the doping levels of the zones in such a way that these zones can be formed simultaneously with other zones of one or several circuit elements. A suitable value for the doping concentration lies between $5 \times 10^{11}$ and $5 \times 10^{12}$ atoms per $cm^2$.

The circuit zone may form part of various high-voltage circuit elements. A first type of an embodiment of a device according to the invention is characterized in that the circuit element comprises a junction field effect transistor, called JFET hereinafter, whose gate electrode is formed by the circuit zone and whose channel is formed by a portion of the first region of the first conductivity type situated below the circuit zone. The gate electrode in fact divides the island into two portions, one portion to which a high voltage is applied and which forms the drain of the JFET, and one portion situated at the other side of the gate electrode and forming the source. The relevant breakdown-voltage-raising zone need only be provided at the side of the gate electrode facing the drain. Since the transistor enters the pinch-off state in the case of a high voltage at the drain, during which the channel at the drain side is fully depleted, the voltage at the source side of the channel will remain comparatively low, and thus also the field across the pn junction between the island insulation and the adjoining portion of the island. Low-voltage elements may be provided in this portion of the island, or a connection to circuit elements in a low-voltage island. If so desired, circuit elements operating at high voltages may be provided in the drain region.

A second type of embodiment of a device according to the invention is characterized in that the circuit element is an insulated gate field effect transistor in which at least one surface zone of the first conductivity type, which forms one of the source and drain regions of the transistor, is provided in the circuit zone of the second conductivity type which forms the backgate region of the transistor. Such transistors may be of the type often designated with DMOST or double-diffused MOST in the literature and are used inter alia because of the high power that can be switched through these transistors. In this embodiment also the drain, to which the drift region belongs and which is situated between the drain connection and the backgate region, is formed by a portion of the island to which a high voltage can be applied. The side of the backgate region adjoining the drift region is provided with the voltage-raising zone. In cases in which the backgate region is set at the same potential as the substrate, the backgate region is preferably provided directly against the island insulation.

A third type of embodiment of a device according to the invention is characterized in that the circuit zone forms the drain of an insulated gate field effect transistor which further comprises a source of the second conductivity type and a channel region formed by a portion of the first region situated between the source and the drain, while the second breakdown-voltage-raising surface zone forms a drain extension situated between the channel region and the drain. This transistor may be used as a p-channel MOST for high voltages when the island, as is usual, is of the n type. The doping concentration of the drain extension may be chosen on the one hand to be sufficiently high, for example $2 \times 10^{12}$ per $cm^2$, for a sufficiently low transistor resistance, and on the other hand to be sufficiently low in view of the breakdown voltage.

BRIEF DESCRIPTION OF THE DRAWINGS

The invention will be explained in more detail with reference to several embodiments and the accompanying diagrammatic drawing, in which.

DESCRIPTION OF THE PREFERRED EMBODIMENTS

Figure 1:
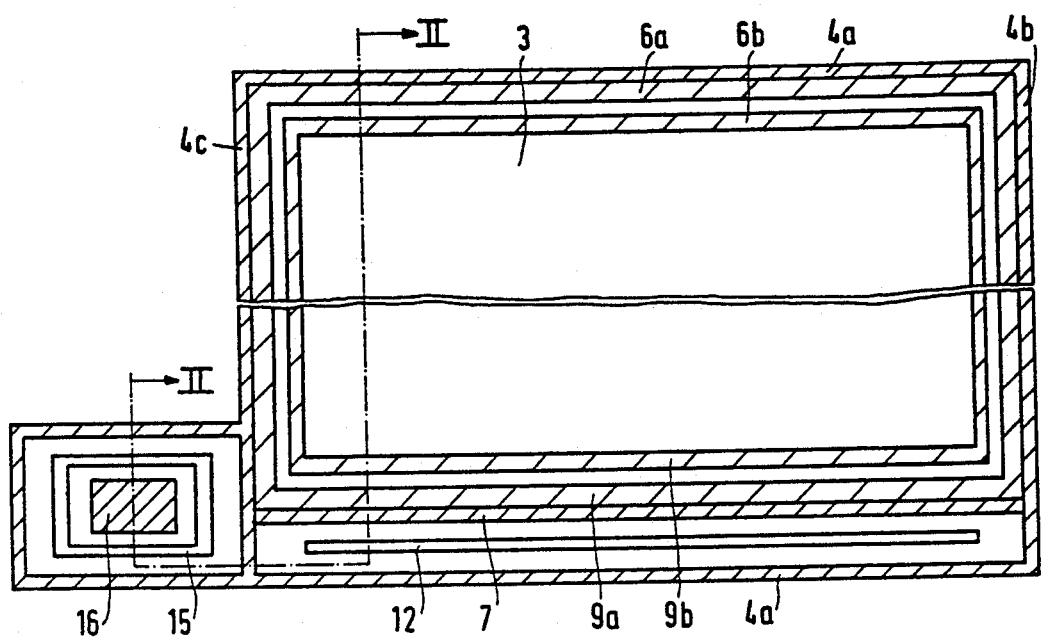
FIG. 1 is a plan view of a portion of a semiconductor device according to the invention.
Figure 2:
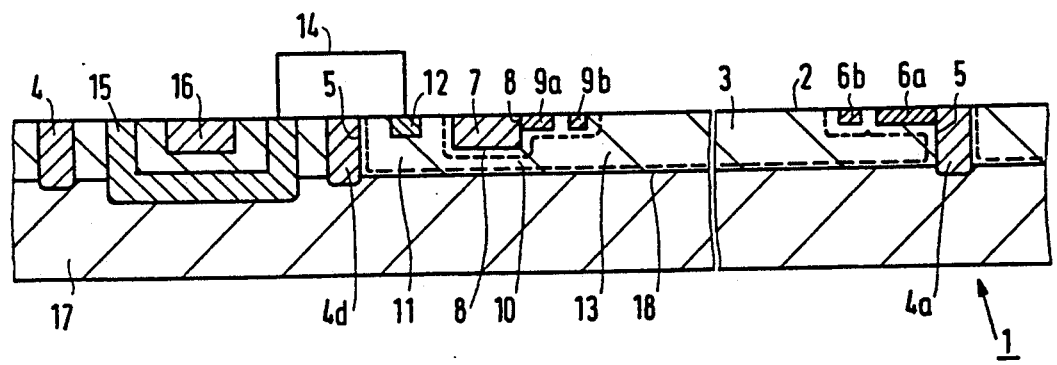
FIG. 2 is a cross-section of this device taken on the line II—II in FIG. 1.

The device of FIGS. 1 and 2 is an integrated high-voltage circuit provided in a semiconductor body 1 which in the present example is made of silicon, but which obviously may also be made of an alternative suitable semiconductor material. An island-shaped portion 3 of a first conductivity type, in this example the n type, adjoining the surface 2 is defined in the silicon body 1. Within the body 1, the island-shaped portion 3 is bounded at its side walls along its entire circumference by a second region 4 of the opposite conductivity type, so of the p type, also adjoining the surface 2. The island-shaped portion 3 and the adjoining p-type region 4 form a pn junction 5 which is reverse-biased so as to insulate the region 3 electrically. To raise the breakdown voltage of the pn junction 5, the p-type region 4 is provided with a breakdown-voltage-raising edge 6 in the form of a p-type surface zone, called first surface zone hereinafter, provided in the island-shaped region 3. In the present embodiment, the voltage-raising zone 6, at least the portion 6a, directly adjoins the region 4, while in alternative embodiments the zone 6 may be situated at a distance from the region 4, i.e. at such a small distance that the zone 6, or at least the portion 6a, lies within the depletion region formed in the island-shaped region 3 in the case of a sufficiently high reverse-bias voltage across the pn junction 5, as is described inter alia in the cited U.S. Pat. No. 4,750,028. The depletion region is diagrammatically indicated with broken lines in FIG. 2.

According to the invention, the breakdown-voltage-raising zone 6 extends only along part of the circumference of the island-shaped portion 3 next to the p region 4. In the example according to FIG. 1, in which the island-shaped portion 3 is rectangular, the p-type zone 6 is provided at the upper side of the rectangle and bounded by the p-type region 4a, and at the sides transverse thereto, bounded by the p-type regions 4b and 4c. The portion 4d of the p-type region 4 defining the lower side of the island-shaped region 3 is free from the breakdown-voltage-raising zone 6. Near the p-type region 4d is situated at least one zone 7, called circuit zone hereinafter, of the opposite conductivity type, so of the p-type, forming part of a circuit element, in the present embodiment a junction field effect transistor or JFET whose gate electrode is formed by the p-type zone 7. This zone forms a pn junction 8 with the island-shaped portion 3 which is reverse-biased during operation. Measures are taken for also raising the breakdown voltage of the pn junction 8 to enable the JFET to operate at high voltages, i.e. voltages comparable to the voltages across the pn junction 5 being applied across the pn junction 8. For this purpose, the zone 7 is also provided with a breakdown-voltage-raising zone 9, called second breakdown-voltage-raising zone hereinafter, of the p type. This zone, at least the partial zone 9a, directly adjoins the zone 7 in the present embodiment. In alternative embodiments, however, the zone 9 may be provided at a distance from the zone 7 i.e. at such a small distance that the zone 9, at least the partial zone 9a, lies entirely within the depletion region of the blocked pn junction 8 formed during operation. This depletion region is also indicated with broken lines in FIG. 2.

The partial zones 6a and 9a which adjoin the p-type region 4 and the p-type zone 7, respectively, have a lower doping concentration than the region 4 and the zone 7, respectively, for raising the breakdown voltage. If the breakdown voltage is to be raised further, the breakdown-voltage-raising zones 6 and 9 may each comprise one or several further p-type partial zones which are entirely surrounded by the n-type region within the semiconductor body. Further partial zones 6b and 9b are drawn in the embodiment.

As was noted above, the circuit zone 7 forms the gate of a JFET. The channel 10 of the JFET is formed by the portion of the island-shaped region 3 which extends below the gate 7. The n-type source and drain are formed by the portion 11 with the n+ contact zone 12 and the portion 13 of the island-shaped region 3, respectively. The source 11, 12 is connected to the n-type region 15 forming the cathode of a diode by means of a conductor 14, which is indicated only diagrammatically in the drawing, the anode of said diode being formed by the p-type surface zone 16. In patent application Ser. No. 094,801 filed simultaneously with the present Application under the title "Integrated semiconductor circuit" the contents of which are incorporated in the present Application by reference, an equivalent device for providing a bridge circuit in which the diode forms part of a bootstrap is described. For a more detailed description of the operation of this device the reader is referred to that Application.

The semiconductor body 1 comprises a substrate 17 of the p type which merges via the pn junction 18 into an n-type layer, in the present example an epitaxial layer in which the island 3 and other islands are defined by means of the island insulation zones 4. The thickness of the epi layer is chosen so as to be sufficient for the high voltages to be applied and is, for example, 22 $\mu$m. Instead of an epitaxial layer, the n-type island-shaped regions 3 may also comprise regions of the substrate 17 which have been re-doped, for example, by means of ion implantation. Furthermore, a substrate of insulating material may be used instead of a semiconductor substrate. The resistivity of the epitaxial layer is approximately 6 $\Omega$.cm. The resistivity of the p-type substrate is, for example, approximately 90 $\Omega$c.m. The p-type island insulation 4, which is depicted as a single zone in the drawing, and given the said thickness of the epi layer, may be composed in known manner of a zone diffused from a buried zone and a zone diffused from the surface. The breakdown-voltage-raising zones 6 and 9 may be formed simultaneously, for example, by ion implantation. A specific concentration value lies, for example, between $10^{12}$ and $2\times 5\ 10^{12}$ atoms per cm$^2$. The fact that the breakdown voltage of the island insulation 4 is not reduced by the absence of the breakdown-voltage-raising zone 6 at the area of the island insulation region 4d is based on the circumstance that the island is divided by the JFET into a high-voltage portion and a low-voltage portion practically insulated therefrom. It is assumed that the substrate 17 and the island insulation zone 4 and the gate electrode 7 connected to this substrate are at ground potential (=0 V). When the potential of the island rises, the channel 10 of the JFET is pinched off increasingly by the widening of the depletion regions. As long as the channel 10 is not completely pinched off, the island portion 11 forming the source of the JFET will in principle follow the potential of the drain region, i.e. the other portion of the island or high-voltage portion. When the channel 10 is completely pinched off, however, a further voltage rise at the drain of the JFET will not or at least hardly influence the potential in the island portion 11, and thus of the cathode 15 of the diode. The value of the reverse-bias voltage across the pn junction between the n-type source on the one hand and the p-type insulation zone 4d and the gate 7 of the JFET on the other hand as a result will not exceed a comparatively low value which depends on the pinch-off voltage of the JFET. This value may readily be chosen by those skilled in the art, for example through adjustment of the pinch-off voltage of the JFET channel 10 by means of the depth of the gate 7, in such a way that the breakdown-voltage is not exceeded. As a result, the breakdown-voltage-raising zone may be omitted locally. The full reverse-bias voltage can be applied across the pn junction 8 at the side remote from the source 11, as this voltage is accommodated by the breakdown-voltage-raising zone 9.

Figure 3:
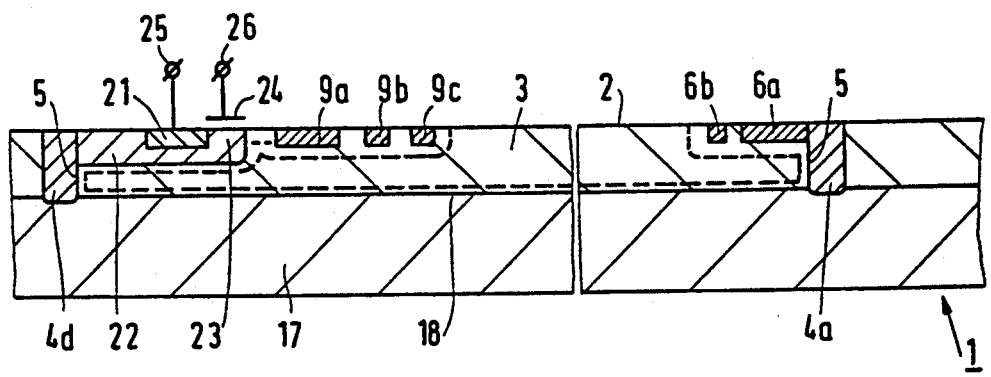
FIG. 3 is a cross-section of a second embodiment of a semiconductor device according to the invention.
Figure 4:
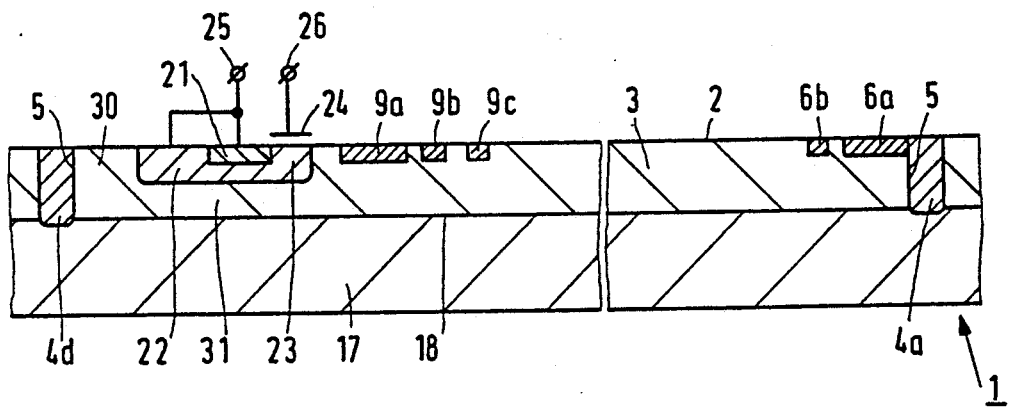
FIG. 4 is a cross-section of a third embodiment of a device according to the invention.

In the embodiment of FIG. 3, the circuit element is formed not by a JFET but by a double-diffused MOS transistor or DMOS transistor. The drain of the transistor is formed by the island 3 (or at least a portion thereof). The source is formed by the n-type surface zone 21 provided by diffusion or implantation into the p-type surface zone 22 which was also diffused or implanted. This latter zone forms the so-called backgate region of the transistor, the channel of the transistor being defined in the surface portion 23 of the zone 22 situated between the island 3 and the source 21. The gate electrode 24 is provided over the channel region 23 and is separated from the surface 2 of the body 1 by a gate oxide layer or some other suitable dielectric. The gate 24 is depicted only diagrammatically in the drawing; the gate oxide is not indicated. The source is provided with a diagrammatically indicated connection 25, the gate with a connection 26. The island 3 is laterally bounded by the p-type island insulation zone 4 which is provided with the breakdown-voltage-raising edge 6 which extends, as in the preceding example, only along part of the circumference of the island 3, leaving the portion 4d of the island insulation free. Avalanche breakdown of the pn junction 5 at the island insulation 4d is prevented by the presence of the p-type circuit zone 22 formed by the backgate of the DMOST. To increase the breakdown voltage between the backgate 22 and the island 3, this backgate is provided with a breakdown-voltage-raising zone 9 which lies entirely within the depletion region at the pn junction of the backgate at least at a high drain voltage. FIG. 3 shows the boundary of the depletion region in broken lines. The p-type zone 9 is built up from a number of mutually separated partial zones 9a, 9b, etc also in the present example, in which the zone 9a may extend fully up to the backgate locally, as is described in the European Patent Application No. 92201456.8 filed by In the present embodiment, the backgate 22 adjoins the island insulation zone 4, so that a compact construction can be obtained. During operation the zone 22 is at a fixed potential, for example, 0 V. When a high voltage is applied to the drain, breakdown at the island insulation zone 4d is prevented first of all in that the pn junction 5 between the insulation zone 4d and the island 3 no longer ends at the surface 2 (at least at the side of the high-voltage island 3) owing to the presence of the adjoining backgate 22. The breakdown voltage is accordingly determined by the breakdown voltage of the backgate 22, which has been raised to a desired high value by means of the breakdown-voltage-raising edge 9. In addition, the n-type region between the p-type backgate and the p-type substrate can be fully depleted at a high drain voltage, whereby the voltage in the n-type region at the area of the pn junction 5 remains lower than the drain voltage. In the embodiment of FIG. 3, the backgate region 22 lies at a fixed potential (ground) via the island insulation. It is often desirable, for example in view of the voltages to be applied to the gate 24, to connect the backgate region 22 to the source 21. Such an embodiment is shown in FIG. 4. The backgate region 22 is situated close to, but at a certain distance from the island insulation 4d and has a conducting connection to the source 21. Between the backgate region 22 and the island insulation 4d lies the n-type region 30 which forms a pn junction 5, which ends at the surface 2, with the island insulation 4d. Breakdown of this pn junction is prevented in principle in the same manner as in the first embodiment by means of the parasitic JFET whose source is formed by the region 30, whose drain is formed by the island 3, whose gate is formed by the backgate region 22 and by the substrate 17, and whose channel is formed by the n-type region 31 between the zone 22 and the substrate. The potential in the region 30 will follow a rising drain voltage until the parasitic channel 31 has been pinched off. A further rise in the drain voltage will not or hardly cause the voltage in the region 31 to rise, so that the reverse-bias voltage across the pn junction 5 of the island insulation 4d can be limited to a value lower than the breakdown voltage of this pn junction.

Figure 5:
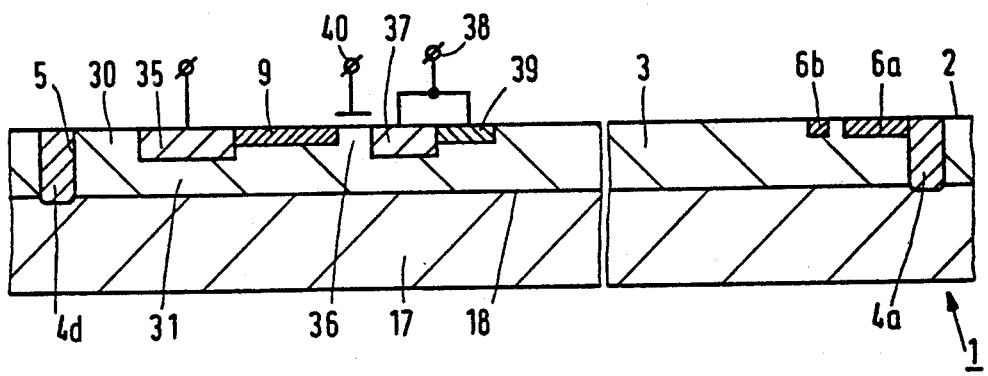
FIG. 5 is a cross-section of a fourth embodiment of a semiconductor device according to the invention. It is noted that the drawing is only diagrammatic and not true to scale. Corresponding parts in the various embodiments are given the same reference numerals as much as possible.

FIG. 5 shows an embodiment of a device according to the invention in which the circuit element situated adjacent the portion 4d of the island insulation not protected against breakdown comprises a p-channel MOS transistor. The p-type circuit zone adjacent the insulation zone 4d is formed by the p-type drain 35 of the MOST and is provided with a high-ohmic zone 9 which adjoins the drain 35 and forms a drain extension. The p-type source zone 37 which is short-circuited with the n-type island 3, which forms a backgate of the transistor, by the source connection 38 through a highly doped n-type zone 39 is separated from the drain extension by the channel 36. Above the channel 36 is provided the gate 40 which is separated from the surface 2 by the usual gate oxide (not shown). In this example also, the insulation zone 4d is not provided with the breakdown-voltage-raising zone 9 as provided at the portion 4a of the island insulation, for saving space. In an analogous manner as in the preceding example, avalanche breakdown at the zone 4d is prevented by means of the parasitic JFET with the drain 35 of the MOST in conjunction with the substrate 17 as the gate. When a high voltage is applied to the island 3, and thus to the source 37 of the MOST, i.e. a voltage much higher than the voltage at the drain 35, the channel 21 is pinched off again so that the potential in the n-type region 30 adjoining the insulation zone 4d will not rise further than a predetermined value, lower than the breakdown voltage.

Simultaneously, the drain extension 9 prevents breakdown at the pn junction between the drain 35 and the island 3. The drain extension 9 may be manufactured simultaneously with the zone 6.

In the embodiments described here, the RESURF principle known from the literature is preferably used, whereby electric fields at the surface are reduced in that the epi layer (or island 3) is depleted over its entire thickness at least locally at a voltage which is lower than the breakdown voltage. In the examples given, the epi layer 3 is locally depleted from the epi-substrate pn junction, partly through the blocked pn junction between the epi layer and the breakdown-voltage-raising zones 6 and 9. The invention may also be used advantageously, however, in the case in which the RESURF principle is not used and in which the breakdown-voltage-raising zones are comparable, for example, to the Kao rings also known from the literature. It will be clear that the invention is not limited to the embodiments given here but that many more variations are possible to those skilled in the art within the scope of the invention. Thus the drain 35 in the last example may directly adjoin the island insulation 4d when this drain is applied to ground during operation. Instead of an MOS transistor, some other suitable circuit element may be provided next to the unprotected portion of the island insulation, for example, a vertical npn transistor of which the p-type base is provided with a breakdown voltage raising zone. Furthermore, the conductivity types may all be reversed in the examples given here.

We claim:

1. A semiconductor device with a semiconductor body comprising an island-shaped first region of a first conductivity type adjoining a surface and also adjoining a surface a second region of the second conductivity type which, seen at the surface, surrounds the first region along its entire circumference and forms a pn junction therewith and which second region is provided with a breakdown-voltage-raising zone in the form of a first surface zone of the second conductivity type which is provided in the first region and which first surface zone is situated at such a small distance from the second region that, given a sufficiently high voltage in the reverse-bias direction across the pn junction, the first surface zone is entirely situated within the depletion region of the pn junction, characterized in that the breakdown-voltage-raising zone extends only along part of the circumference of the first region adjacent the second region and in that in the first region, adjacent a portion of the second region which is free from the breakdown-voltage-raising zone, a circuit zone of the second conductivity type is situated which forms part of a circuit element and which at a side remote from the portion of the second region which is free from the breakdown-voltage-raising zone is provided with a second breakdown-voltage-raising surface zone of the second conductivity type which is present at such a small distance from the circuit zone that, given a sufficiently high voltage in the reverse-bias direction across the pn junction between the circuit zone and the first region, the second breakdown-voltage-raising zone lies entirely within the depletion region of the last-recited pn junction.

2. A semiconductor device as claimed in claim 1, characterized in that the first and the second breakdown-voltage-raising surface zones each comprise a partial zone of the second conductivity type, which partial zones adjoin the second region and the circuit zone, respectively, and have a lower doping concentration than that of the adjoining second region or circuit zone.

3. A semiconductor device as claimed in claim 2, characterized in that the first and the second breakdown-voltage-raising zones each also comprise at least one further partial zone which is situated at a distance from the first partial zone and which is entirely surrounded by the first region of the first conductivity type within the semiconductor body.

4. A semiconductor device as claimed in claim 1, characterized in that the circuit element comprises a junction field effect transistor, whose gate electrode is formed by the circuit zone and whose channel is formed by a portion of the first region of the first conductivity type situated below the circuit zone.

5. A semiconductor device as claimed in claim 1, characterized in that the circuit element is an insulated gate field effect transistor in which at least one surface zone of the first conductivity type, which forms one of the source and drain regions of the transistor, is provided in the circuit zone of the second conductivity type which forms a backgate region of the transistor.

6. A semiconductor device as claimed in claim 5, characterized in that the transistor is of the double-diffused DMOST type in which the surface zone of the first conductivity type formed in the circuit zone forms the source of the transistor and a portion of the first region of the first conductivity type adjoining the circuit zone forms the drain of the transistor.

7. A semiconductor device as claimed in claim 6, characterized in that the circuit zone adjoins and is connected to the second region of the same conductivity type as the circuit zone.

8. A semiconductor device as claimed in claim 2, characterized in that the circuit zone forms the drain of an insulated gate field effect transistor which further comprises a source of the second conductivity type and a channel region formed by a portion of the first region situated between the source and the drain, while the second breakdown-voltage-raising surface zone forms a drain extension situated between the channel region and the drain.

9. A semiconductor device as claimed in claim 1, characterized in that the breakdown-voltage-raising zones have a doping concentration of between $5 \times 10^{11}$ and $5 \times 10^{12}$ at/cm$^2$.

* * * * *